(12) United States Patent
Ihara et al.

(10) Patent No.: US 9,793,310 B2
(45) Date of Patent: Oct. 17, 2017

(54) IMAGE SENSOR DEVICES USING OFFSET PIXEL PATTERNS

(71) Applicant: Samsung Electronics Co., Ltd., Suwon-si, Gyeonggi-do (KR)

(72) Inventors: Hisanori Ihara, Seongnam-si (KR); Jun-Seok Yang, Seoul (KR); Sang-Il Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/065,962

(22) Filed: Mar. 10, 2016

(65) Prior Publication Data

US 2016/0268321 A1    Sep. 15, 2016

(30) Foreign Application Priority Data

Mar. 11, 2015    (KR) .................. 10-2015-0034040

(51) Int. Cl.
*H01L 27/146*    (2006.01)

(52) U.S. Cl.
CPC ...... *H01L 27/1463* (2013.01); *H01L 27/1461* (2013.01); *H01L 27/14607* (2013.01); *H01L 27/14612* (2013.01); *H01L 27/14645* (2013.01)

(58) Field of Classification Search
CPC ............... G02B 7/36; H01L 27/14627; H01L 27/14605
See application file for complete search history.

(56) References Cited

U.S. PATENT DOCUMENTS

| | | | |
|---|---|---|---|
| 7,612,812 B2 | 11/2009 | Yamada | |
| 7,821,090 B2 | 10/2010 | Akiyoshi | |
| 7,825,970 B2 | 11/2010 | Choi et al. | |
| 7,872,287 B2 | 1/2011 | Masuoka et al. | |
| 8,569,855 B2 | 10/2013 | Yokogawa | |
| 8,822,897 B2 | 9/2014 | Tian et al. | |
| 9,432,113 B2* | 8/2016 | Oi ....................... | H04J 14/0221 |
| 2003/0151075 A1 | 8/2003 | Shizukuishi | |
| 2005/0104989 A1* | 5/2005 | Shizukuishi ........... | H04N 9/045 348/337 |
| 2006/0118837 A1 | 6/2006 | Choi | |
| 2007/0018073 A1 | 1/2007 | Hsu et al. | |
| 2008/0018765 A1 | 1/2008 | Choi et al. | |
| 2010/0171854 A1 | 7/2010 | Yokogawa | |
| 2012/0268566 A1 | 10/2012 | Kim et al. | |
| 2013/0127002 A1 | 5/2013 | Okigawa | |

(Continued)

FOREIGN PATENT DOCUMENTS

| | | |
|---|---|---|
| JP | 2007-288294 | 11/2007 |
| JP | 2009-158689 | 7/2009 |

(Continued)

OTHER PUBLICATIONS

Yamada et al. "MP 6.5 A Progressive Scan CCD Imager for DSC Applications" 2000 IEEE International Solid-State Circuits Conference, 2 Pages.

*Primary Examiner* — Dung Le
(74) *Attorney, Agent, or Firm* — Ward and Smith, P.A.

(57) ABSTRACT

A device includes a substrate and a plurality of unit pixels disposed in and/or on the substrate, arranged in a honeycomb pattern and separated from one another by a deep trench isolation (DTI) layer. The plurality of unit pixels may include a group of unit pixels radially arranged around and equidistant from a central unit pixel.

9 Claims, 28 Drawing Sheets

(56) References Cited

U.S. PATENT DOCUMENTS

2013/0153748 A1    6/2013  Suzuki et al.
2015/0015768 A1*  1/2015  Tanaka ................. H04N 5/2254
                                                                       348/342

FOREIGN PATENT DOCUMENTS

| JP | 2010-153603 | 7/2010 |
| --- | --- | --- |
| KR | 10-2009-0037604 A | 4/2009 |
| KR | 10-2014-0029933 A | 3/2014 |

\* cited by examiner

3000

5000

7000

IMAGE SENSOR DEVICES USING OFFSET PIXEL PATTERNS

CROSS-REFERENCE TO RELATED APPLICATION

This application claims the benefit of Korean Patent Application No. 10-2015-0034040, filed on Mar. 11, 2015, in the Korean Intellectual Property Office, the disclosure of which is incorporated by reference herein in its entirety.

BACKGROUND

The inventive concepts relates to image sensor devices and, more particularly, to pixel patterns for images sensor devices.

An image sensor is a device for capturing a 2-dimensional (2D) or a 3-dimensional (3D) image of a target object. An image sensor generates an image of a target object by using a photoelectric transforming element that reacts based on an intensity of light reflected by the target object. Recently, as technologies related to a complementary metal-oxide semiconductor (CMOS) are developed, CMOS-based image sensors have become widely used, and there is an increased demand for more reliable images due to the widespread use of smart phones and digital cameras.

SUMMARY

The inventive concepts provide image sensors using pixel patterns capable of maintaining process reliability even for a fine pixel pattern.

Some embodiments provide a device including a substrate and a plurality of unit pixels disposed in and/or on the substrate, arranged in a honeycomb pattern and separated from one another by a deep trench isolation (DTI) layer. The plurality of unit pixels may include a group of unit pixels radially arranged around and equidistant from a central unit pixel.

In some embodiments, the DTI layer includes a Y-shaped portion between adjacent first, second and third unit pixels of the plurality of unit pixels. In some embodiments, the first, second and third unit pixels are separated from one another by a distance x, and a portion of the DTI layer bounded by segments connecting adjacent corners of the first, second and third unit pixels has an area S given by:

$$S < x^2.$$

In further embodiments, each of the first, second and third unit pixels has a rounded hexagonal shape and the portion of the DTI layer bounded by the segments connecting the adjacent corners of the first, second and third unit pixels has an area S given by:

$$S = \frac{\sqrt{3}}{4}(x + 2a')^2,$$

wherein a' denotes a corner rounding width. The distance x may be from about 100 nm to about 300 nm.

In further embodiments, each of the unit pixels may include a shallow trench isolation (STI) pattern that defines at least one or more active areas within the unit pixel.

Some embodiments provide a device including a substrate and a plurality of unit pixels with rounded corners disposed in and/or on the substrate and separated from one another by a DTI layer, the plurality of unit pixels arranged in rows along a first direction and in a zig-zag pattern along a second direction perpendicular to the first direction.

In some embodiments, each of the unit pixels may have a rectangular shape. A portion of the DTI layer bounded by adjacent first, second and third unit pixels of the plurality of unit pixels may be T-shaped. Adjacent unit pixels in each of the rows may be separated by a distance x, and a rectangular portion of the DTI layer defined by adjacent corners of first and second unit pixels in a first one of the rows and an adjacent side of third unit pixel in an adjacent second one of the rows may have an area S given by:

$$S = \frac{1}{2}(\sqrt{2}x + a')^2,$$

wherein a" denotes a corner rounding width.

In further embodiments, each of the unit pixels may include a protrusion on at least one side extending in the first direction. Adjacent unit pixels in each of the rows may be separated by a distance x, and a rectangular portion of the DTI layer defined by adjacent corners of first and second unit pixels in a first one of the rows and an adjacent side of third unit pixel in an adjacent second one of the rows may have an area S given by:

$$S = \frac{1}{2}(\sqrt{2}x + a'')^2 - Sp,$$

wherein a" denotes a corner rounding width and Sp denotes an area of the protrusion.

In still further embodiments, each of the unit pixels may have a circular shape, adjacent first and second unit pixels in a first one of the rows may be separated from one another by a distance x, each of the first and second unit pixels may be separated from an adjacent third unit pixel in an adjacent second one of the rows by the distance x, and a triangular portion of the DTI layer defined by segments between the first, second and third unit pixels may have an area S given by:

$$S = \frac{\sqrt{3}}{4}(x + (2 - \sqrt{3})*r)^2.$$

wherein r denotes a radius of the first, second and third unit pixels. The distance x and the radius r satisfy the following:

$$r \leq 1.939x.$$

Additional embodiments provide a device including a substrate and a plurality of unit pixels disposed in and/or on the substrate and arranged in rows that are offset with respect to one another. The device further includes an isolation layer separating adjacent ones of the unit pixels from one another. The plurality of unit pixels may be arranged in a honeycomb arrangement. The plurality of unit pixels may be arranged in a zig-zag fashion along a direction perpendicular to the rows. Each of the unit pixels of the plurality of unit pixels may be polygonal or circular. Each of the unit pixels of the plurality of unit pixels may be polygonal with rounded corners.

BRIEF DESCRIPTION OF THE DRAWINGS

Some embodiments of the inventive concepts will be more clearly understood from the following detailed description taken in conjunction with the accompanying drawings in which.

DETAILED DESCRIPTION OF THE EMBODIMENTS

Figure 1:
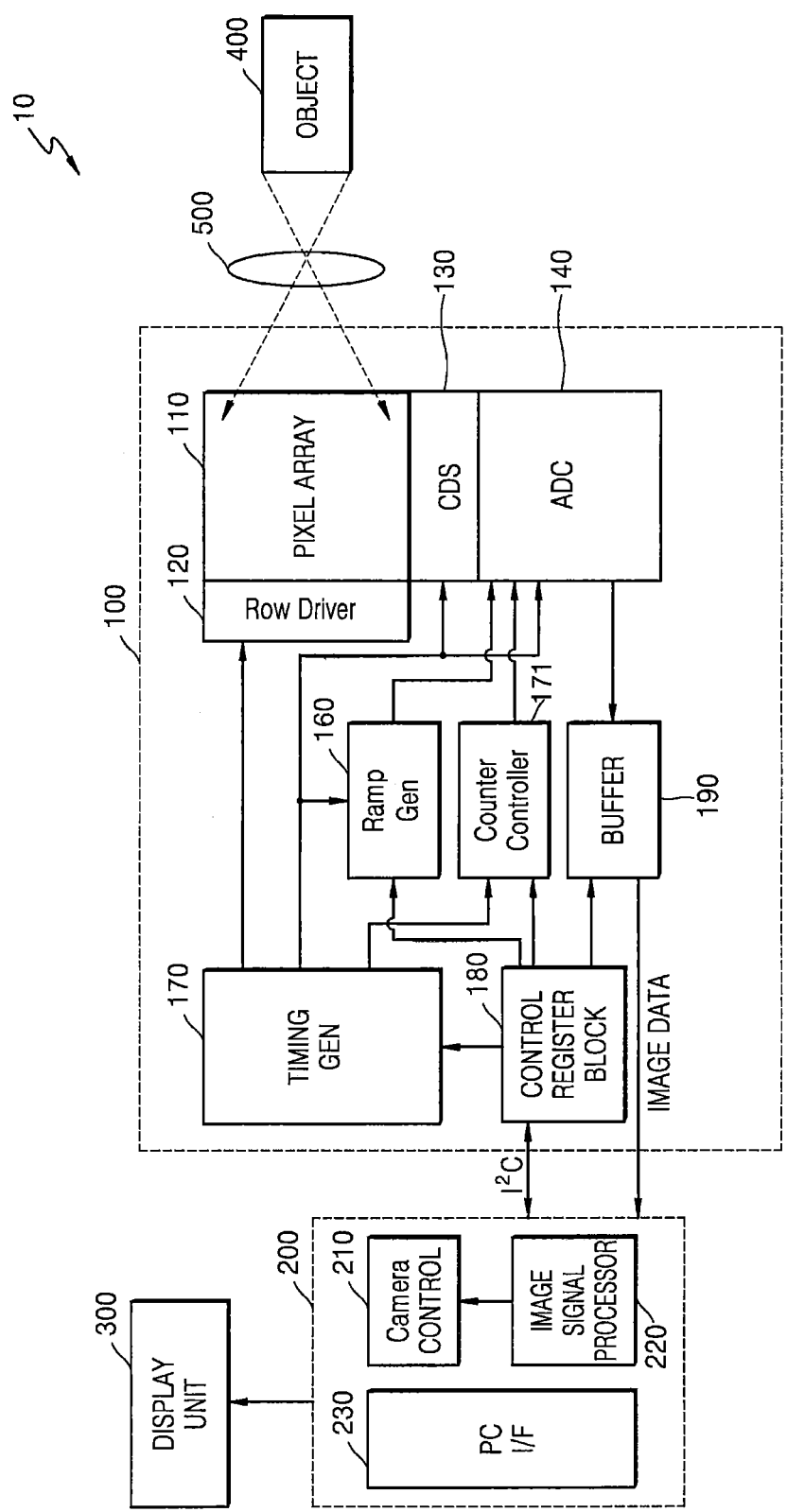
FIG. 1 is a block diagram showing an image processing system may including a pixel pattern according to some embodiments.

Expressions such as "at least one of" when preceding a list of elements, modify the entire list of elements and do not modify the individual elements of the list.

The inventive concepts will now be described more fully with reference to the accompanying drawings, in which some embodiments of the inventive concepts are shown. Like reference numerals in the drawings denote like elements, and thus their description will be omitted.

The inventive concepts may, however, be embodied in many different forms and should not be construed as being limited to the embodiments set forth herein; rather, these embodiments are provided so that this disclosure will be thorough and complete, and will fully convey the concepts of the inventive concepts to those of ordinary skill in the art.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain exemplary embodiment may be implemented differently, a specific process order may be performed differently from the described order. For example, two consecutively described processes may be performed substantially at the same time or performed in an order opposite to the described order.

Some embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of areas illustrated herein but are to include deviations in shapes that result, for example, from manufacturing.

FIG. 1 is a block diagram showing an image processing system 10 according to some embodiments.

Referring to FIG. 1, the image processing system 10 according to some embodiments may include an image sensor 100, an image processor 200, a display unit 300, and a lens 500.

According to some embodiments, the image sensor 100 may include a pixel array 110, a row driver 120, a correlated double sampling (CDS) block 130, an analog-digital converter (ADC) 140, a ramp signal generator 160, a timing generator 170, a counter controller 171, a control register block 180, and a buffer 190.

The image sensor 100 may sense a target object 400 captured by the lens 500 under the control of the image processor 200, and the image processor 200 may display an image sensed and output by the image sensor 100 at the display unit 300. The display unit 300 may be embodied as one of various devices capable of displaying images. For example, the display unit 300 may be embodied as a computer, a mobile phone, or an electronic device with a camera.

The image processor 200 may include a camera control unit 210, an image signal processor 220, and a PC interface (I/F) 230. The camera control unit 210 may control the control register block 180. The camera control unit 210 may control the image sensor 100, that is, the control register block 180 by using an inter-integrated circuit (I2C). However, the inventive concepts are not limited thereto.

The image signal processor 220 may receive image data, which is data output by the buffer 190, process the image data to generate an image that may be easily viewed by a person, and output the processed the image data to the display unit 300 via the PC I/F 230.

Although FIG. 1 shows that the image signal processor 220 is arranged inside the image processor 200, the inventive concepts is not limited thereto. For example, the image signal processor 220 may be arranged in the image sensor 100 instead.

The pixel array 110 may include a photosensitive element, such as a photo diode, a photo transistor, a photo gate, or a pinned photo diode (PPD). The pixel array 110 may detect a light by using the photosensitive element and transform the light into electric signals, thereby generating video signals.

The timing generator 170 may control operations or timings of the row driver 120, the ADC 140, the ramp signal generator 160, and the counter controller 171 by outputting control signals or clock signals to the row driver 120, the ADC 140, the ramp signal generator 160, and the counter controller 171, and the control register block 180 may control operations of the timing generator 170, the counter controller 171, and the buffer 190 by outputting control signals to the timing generator 170, the counter controller 171, and the buffer 190. The control register block 180 may be operated under the control of the camera control unit 210.

The counter controller 171 receives a control signal from the control register block 180, transmits counter control signals (CCS) to a plurality of counters (not shown) included in the ADC 140, and controls operations of the counters (not shown).

The row driver 120 may drive the pixel array 110 row-by-row. For example, the row driver 120 may generate a transfer control signal for controlling transfer transistors, a reset control signal for controlling reset transistors, and a select control signal for controlling select transistors of each of unit pixels constituting the pixel array 110. Furthermore, the pixel array 110 outputs a reset signal and a video signal from a row selected based on a row select signal provided by the row driver 120 to the CDS block 130. The CDS block 130 may perform correlated double sampling on the reset signal and the video signal.

The ADC 140 compares ramp signals provided by the ramp signal generator 160 to correlated double sampled signals output by the CDS block 130 to generate result signals, counts transitions of the result signals, and outputs a count result to the buffer 190.

The buffer 190 temporarily stores, senses, and amplifies signals output by the ADC 140. The buffer 190 may include a plurality of column memory blocks (not shown), each of which is included in each column, for temporary storage and a sense amp for sensing and amplifying the digital signals output by the ADC 140.

Figure 2A:
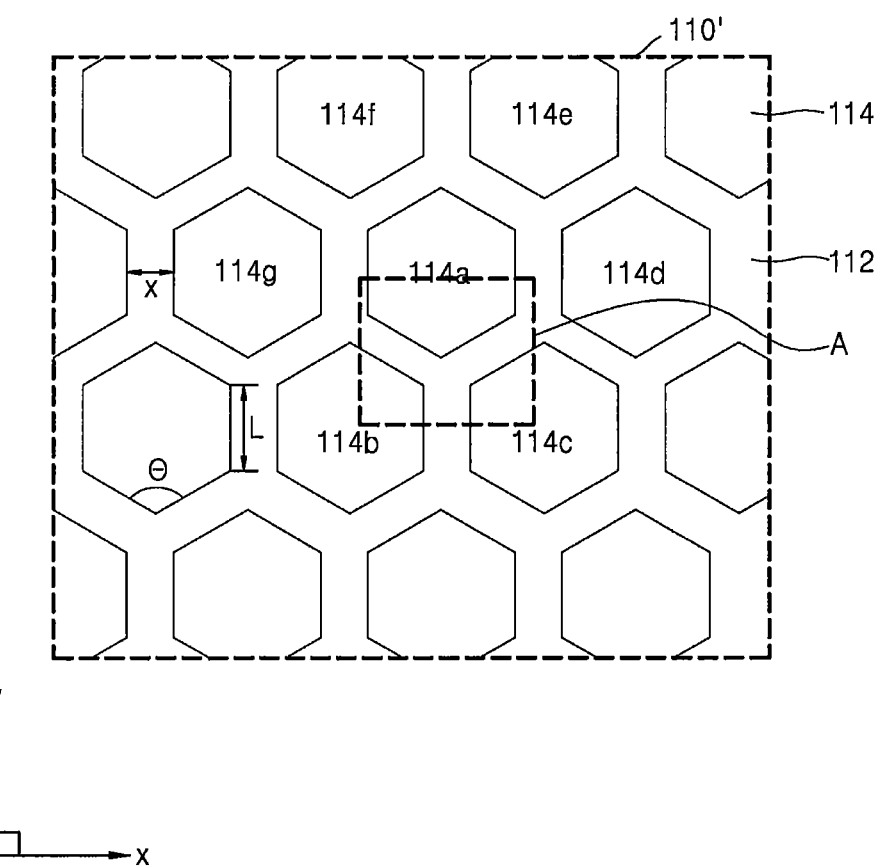
FIG. 2A is a plan view illustrating a portion of a pixel array according to further embodiments.

FIG. 2A is a plan view illustrating a portion of a pixel array according to some embodiments. Referring to FIG. 2A, a pixel array 110' may be formed on and/or in a substrate may include a device isolation layer 112 and a plurality of unit pixels 114 defined by the device isolation layer 112.

The device isolation layer 112 electrically and/or optically isolating adjacent ones of the unit pixels 114 from one another. The device isolation layer 112 may be formed, for example, by filling a trench in the substrate formed in a deep trench isolation (DTI) operation with a silicon oxide or a polysilicon. The device isolation layer 112 may prevent electric crosstalk that deteriorates a signal-to-noise ratio (SNR) based on carrier exchanges between the unit pixels 114.

Sidewalls of the device isolation layer 112 may be doped with a material with a high optical reflection index, thereby preventing optical crosstalk that deteriorates SNR due to transmission of light, which is incident to a particular unit pixel, to another unit pixel adjacent the particular pixel. The sidewalls of the device isolation layer 112 may be formed of, for example, a polysilicon doped with boron. However, the inventive concepts are not limited thereto.

The plurality of unit pixels 114 may form a particular pixel pattern comprising multiple rows along a first direction (x-axis direction) that are offset with respect to one another so that, for example, the unit pixels 114 are arranged in a zig-zag manner along a second direction (y-axis direction) perpendicular to the first direction (x-axis direction). The unit pixels 114 are separated from one another by a distance x in the pixel array 110'. For example, unit pixels 114*b* through 114*g* may form a honeycomb-like structure in which the unit pixels 114*b* through 114*g* are radially arranged around a unit pixel 114*a*.

Each of the unit pixels 114 may have various 2-dimensional (2D) shapes. According to some embodiments, the unit pixels 114 may have a regular hexagonal shape with six same-length sides and six identical corner angles θ as illustrated in FIG. 2A. According to some embodiments, the unit pixels 114 may have a non-regular hexagonal shape with different-length sides or different-size corner angles θ. According to some embodiments, the unit pixels 114 may have, for example, other polygonal shapes (e.g., square, rectangular, octagonal, etc.), a circular shape, or an elliptical shape.

Each of the plurality of unit pixels 114 may include a plurality of transistors, a photoelectric transforming unit, a ground region, and a floating diffusion area. Detailed descriptions thereof are given below with reference to FIGS. 8 and 9.

Figure 2B:
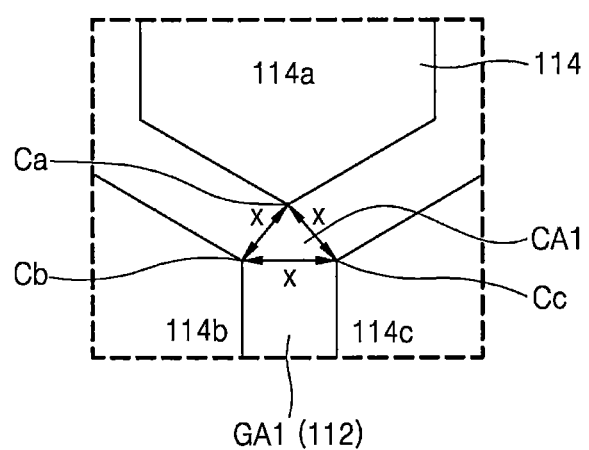
FIG. 2B is a diagram showing a portion A of FIG. 2A in closer detail.

FIG. 2B is a diagram showing a portion A of FIG. 2A in closer detail. Referring to FIG. 2B, if each of the plurality of unit pixels 114 has a hexagonal shape and the plurality of unit pixels 114 are arranged according to the pixel pattern of FIG. 2A, the device isolation layer 112 between adjacent first through third unit pixels 114*a*, 114*b*, and 114*c* may be Y-shaped. A gap area GA1 may include a corner area CA1 defined by corners Ca, Cb, and Cc adjacent one another from among corners of the first through third unit pixels 114*a*, 114*b*, and 114*c*.

An area S1 of the corner area CA1 may satisfy Equation 1:

$$S1 = \frac{\sqrt{3}}{4}x^2. \tag{1}$$

Figure 2C:
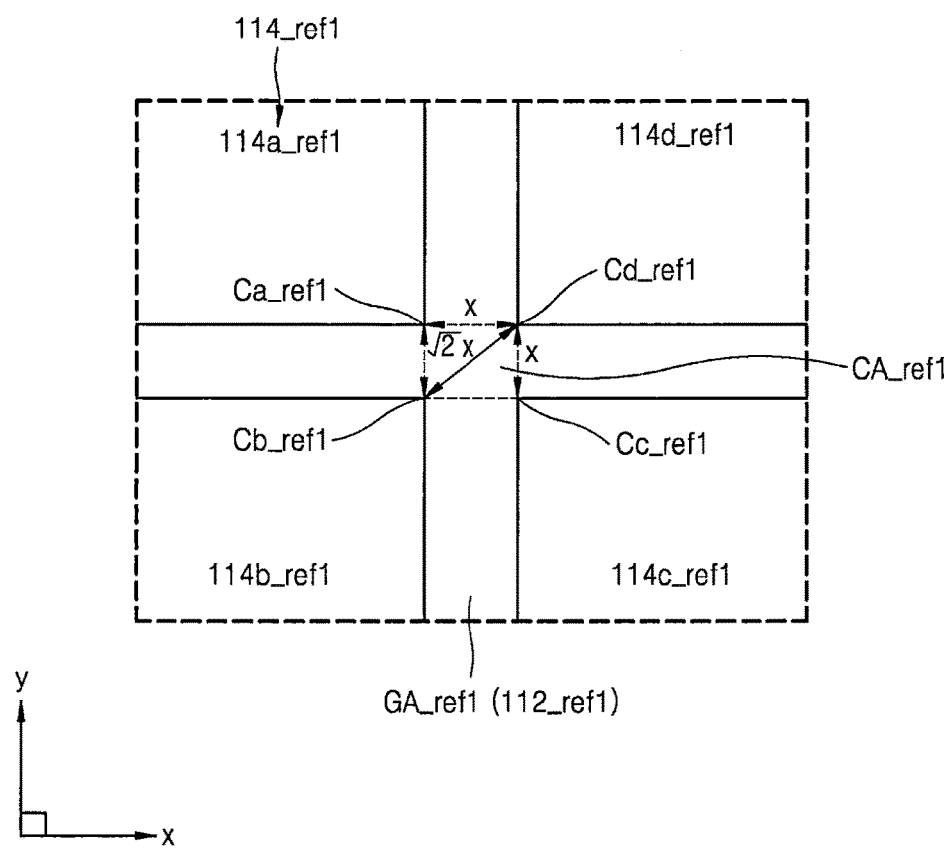
FIG. 2C is a diagram illustrating an effect of the pixel pattern of FIG. 2A and shows an area corresponding to the portion A of FIG. 2A in closer detail.

FIG. 2C is a diagram showing an example of a rectangular pixel array for comparison with the effect of the pixel pattern of FIG. 2A. Referring to FIG. 2C, when each of a plurality of unit pixels 114_ref1 has a rectangular shape and the plurality of unit pixels 114_ref1 are arranged in a matrix structure, a device isolation layer 112_ref1 between first through fourth unit pixels 114*a*_ref1, 114*b*_ref1, 114*c*_ref1, and 114*d*_ref1, that is, a gap area GA_ref1, may have a cross-like shape as shown in FIG. 2C. The gap area GA_ref1 may include a corner area CA_ref1 defined by corners Ca_ref1, Cb_ref1, Cc_ref1, and Cd_ref1 adjacent one another from corners of the first through fourth unit pixels 114*a*_ref1, 114*b* ref1, 114*c*_ref1, and 114*d*_ref1.

An area S_ref1 of the corner area CA_ref1 may satisfy Equation 2:

$$S\_ref1 = x^2. \tag{2}$$

Based on Equation 1 and Equation 2 above, for a same distance between unit pixels (i.e., the distance x), the area S1 of the corner area CA1 of FIG. 2B is smaller than the area S_ref1 of the corner area CA_ref1 of FIG. 2C.

As described above, the reduced corner area CA1 can reduce a risk of stress-based cracks based on a difference between thermal expansion coefficients of a material (e.g., a silicon oxide) constituting the device isolation layer 112 and a material constituting the unit pixels 114 (e.g., polysilicon). Furthermore, the reduced corner area CA1 can reduce the likelihood of formation of voids in the device isolation layer 112 and, therefore, the likelihood of operational defects due to voids may be reduced.

Figure 3A:
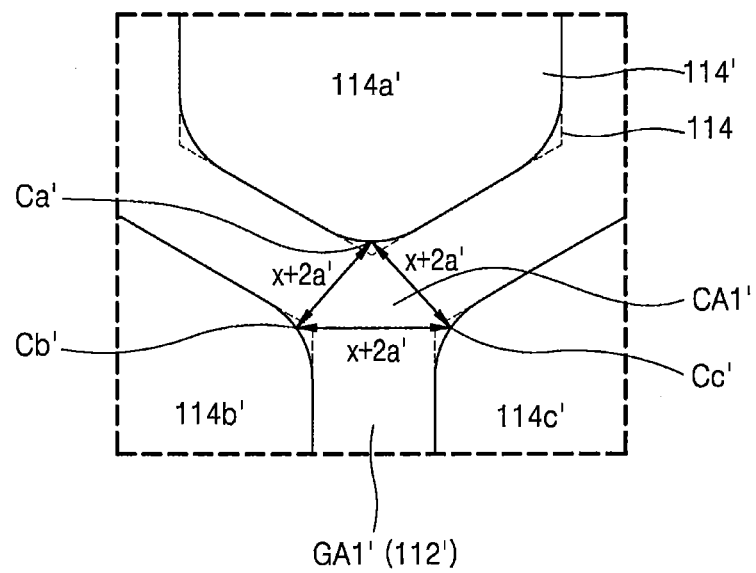
FIG. 3A is a diagram showing the portion A of FIG. 2A in closer detail and illustrating unit pixels with a corner rounding effect.

FIG. 3A is a diagram showing the portion A of FIG. 2A in closer detail and exemplifies unit pixels 114' with a corner rounding effect. Referring to FIG. 3A, the unit pixels 114' with the corner rounding effect may occupy an area smaller than that of the unit pixels 114 of FIG. 2B without the corner rounding effect.

The corner rounding effect may refer to a phenomenon whereby, while a photo operation or an etching operation for forming unit pixels with polygonal shapes are being performed, corners of the unit pixels with polygonal shapes are rounded. Due to the corner rounding effect, corners Ca', Cb', and Cc' of first through third unit pixels 114a', 114b', and 114c' are rounded, and thus the maximum corner spacing width x+2a' between the first through third unit pixels 114a', 114b', and 114c' adjacent one another becomes greater than the intended maximum corner spacing distance x (refer to FIG. 2B).

According to the illustrated embodiments, the device isolation layer 212 between the adjacent first through third unit pixels 114a', 114b', and 114c' may have rounded Y-shaped gap area GA1'.

The corner area CA1' may be defined by the adjacent corners Ca', Cb', and Cc' adjacent one another from among corners of the first through third unit pixels 114a', 114b', and 114c', where an area S1' of the corner area CA1' may satisfy Equation 3:

$$S1' = \frac{\sqrt{3}}{4}(x+2a')^2, \quad (3)$$

where a' denotes a corner rounding width increased at the corners Ca', Cb', and Cc' due to the corner rounding effect.

Figure 3B:
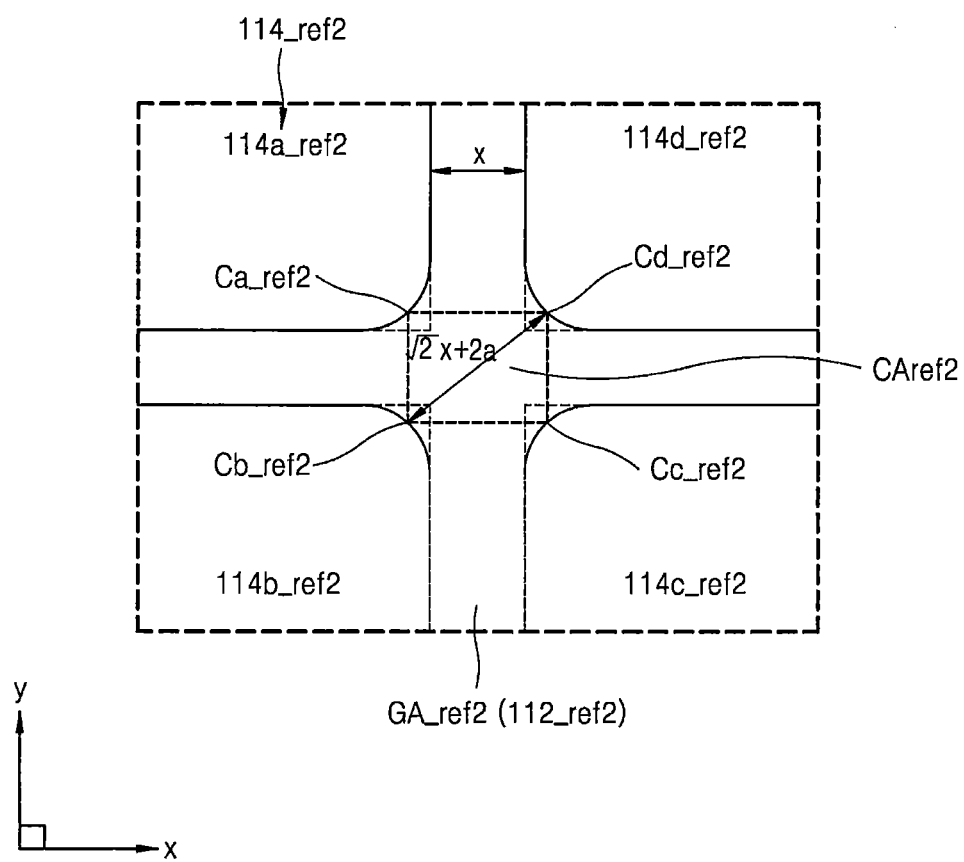
FIG. 3B is a diagram illustrating a difference between unit pixels having a rectangular shape and the unit pixels illustrated in FIG. 3A.

FIG. 3B is a diagram showing an arrangement of rounded rectangular pixels for comparison to the unit pixels described above with reference to FIG. 3A. Referring to FIG. 3B, respective corners Ca_ref2, Cb_ref2, Cc_ref2, and Cd_ref2 of adjacent first through fourth unit pixels 114a_ref2, 114b_ref2, 114c_ref2, and 114d_ref2 may have rounded shapes due to the corner rounding effect described above with reference to FIG. 3A. In other words, the maximum corner spacing width √2x+2a between the first through fourth unit pixels 114a_ref2, 114b_ref2, 114c_ref2, and 114d_ref2 becomes greater than the intended maximum corner spacing width √2x (refer to FIG. 2C).

As described above, when each of a plurality of unit pixels 114_ref2 has a rectangular shape and the plurality of unit pixels 114_ref2 are arranged in a matrix structure, a device isolation layer 112_ref2 between the first through fourth unit pixels 114a_ref2, 114b_ref2, 114c_ref2, and 114d_ref2, that is, a gap area GA_ref2, may have a rounded cross-like shape as shown in FIG. 3B.

The gap area GA_ref2 may include a corner area CA_ref2, defined by rounded corners Ca_ref2, Cb_ref2, Cc_ref2, and Cd_ref2 adjacent one another from among corners of the first through fourth unit pixels 114a_ref2, 114b_ref2, 114c_ref2, and 114d_ref2.

An area S_ref2 of the corner area CA_ref2 may satisfy Equation 4:

$$S\_ref2 = \frac{1}{2}(\sqrt{2}x+2a)^2, \quad (4)$$

where a denotes a corner rounding width increased at the corners Ca_ref2, Cb_ref2, Cc_ref2, and Cd_ref2 due to the corner rounding effect.

Referring to Equation 3 and Equation 4 above, the area S1' of the corner area CA1' of FIG. 3A is greater than the area S1 of the corner area CA1 described above with reference to FIG. 2B, and the area S_ref2 of the corner area CA_ref2 of FIG. 3B is greater than the area S_ref1 of the corner area CA_ref1 described above with reference to FIG. 2C. If unit pixels have a hexagonal shape as shown in FIG. 3A, a corner rounding width increased by the corner rounding effect may become smaller than that in the case where unit pixels have a rectangular shape as shown in FIG. 3B. In other words, the increased corner rounding width a' based on Equation 3 may have a smaller value than the increased corner rounding width a based on Equation 4. The reason therefor is that corners of a hexagonal shape are less affected by the corner rounding effect than corners of a rectangular shape.

Therefore, if unit pixels have a hexagonal shape as shown in FIG. 3A, the area S1 of the corner area CA1 may be reduced compared to the case in which unit pixels have a rectangular shape even without the corner rounding effect (refer to FIG. 2B). Even with the corner rounding effect, a difference between an intended pattern and an actually fabricated pattern may be reduced compared to the case in which unit pixels have a rectangular shape, and thus the area S1' of the corner area CA1' formed between unit pixels adjacent one another may be further reduced.

Figure 4A:
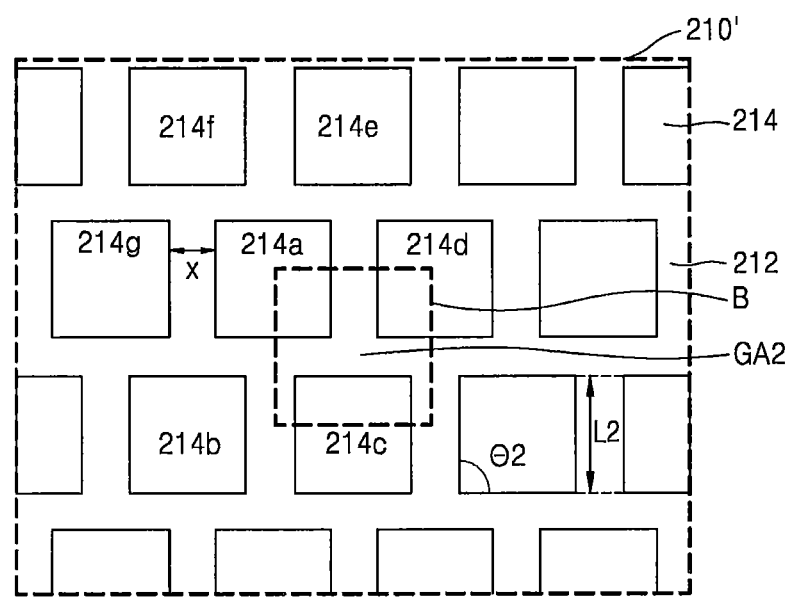
FIG. 4A is a plan view illustrating a portion of a pixel array according to some embodiments.
Figure 4A:
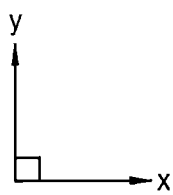

FIG. 4A is a plan view illustrating a portion of a pixel array according to further embodiments. Referring to FIG. 4A, a pixel array 210' formed on and/or in a substrate may include a device isolation layer 212 and a plurality of unit pixels 214 defined by the device isolation layer 212. The device isolation layer 212 may be formed, for example, by filling a trench in the substrate formed in a DTI operation with a silicon oxide or a polysilicon. Along lines discussed above with reference to FIG. 2A, sidewalls of the device isolation layer 212 may be doped with a material with a high optical reflection index, thereby reducing optical crosstalk.

According to some embodiments, the unit pixels 214 may have a square shape with a same length L2 on all four sides and the same corner angles θ2. In some embodiments, the unit pixels 214 may have a rectangular shape with different side lengths L2.

The plurality of unit pixels 214 may form a particular pixel pattern and be separated apart from one another at the distance x in the pixel array 210'. For example, unit pixels 214b through 214g may form a honeycomb-like structure in which the unit pixels 214b through 214g are radially arranged around a unit pixel 214a.

As shown in FIG. 4A, the unit pixels 214 may be linearly arranged along a first direction (x-axis direction) and may be arranged in a zig-zag manner along a second direction (y-axis direction) perpendicular to the first direction (x-axis direction).

If the unit pixels 214 are arranged in the pixel pattern shown in FIG. 4A, the device isolation layer 212 between first through third unit pixels 214a, 214b, and 214c adjacent one another, that is, a gap area GA2, may have a T-like shape. If the gap area GA2 has a T-like shape, increase of a corner area due to the corner rounding effect may be reduced, thereby reducing stress-based cracks and a void.

Figure 4B:
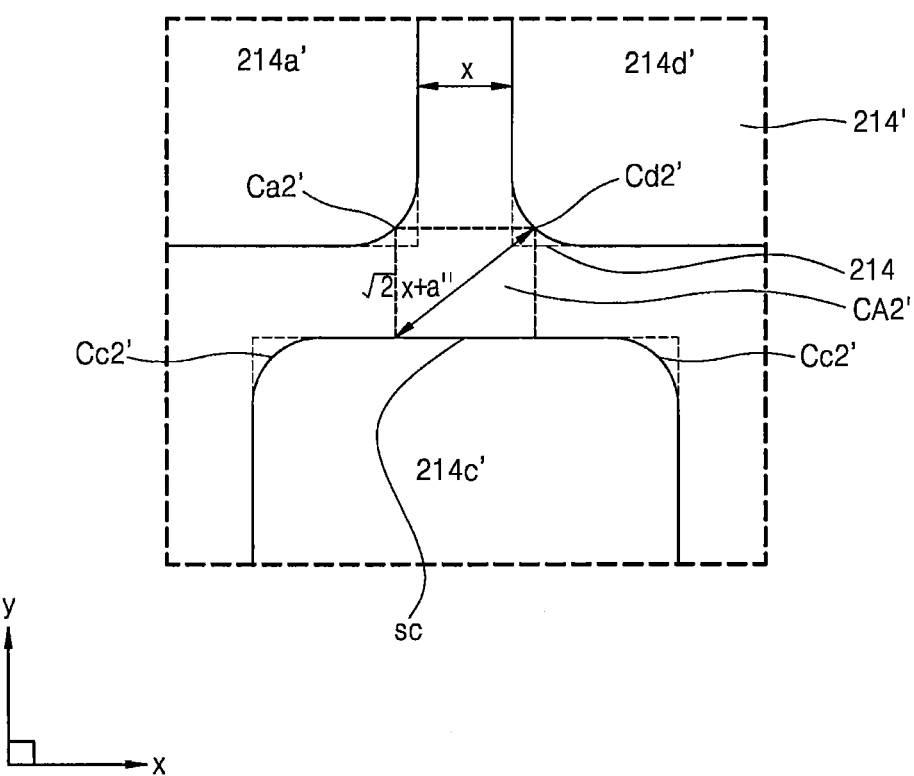
FIG. 4B is a diagram showing a portion B of FIG. 4A in closer detail and illustrating unit pixels with the corner rounding effect.

FIG. 4B is a diagram showing a portion B of FIG. 4A in closer detail and exemplifies unit pixels 214' with the corner rounding effect. Referring to FIG. 4B, the unit pixels 214' with the corner rounding effect may occupy an area smaller than that of the unit pixels 214 without the corner rounding effect.

Since respective corners Ca2' and Cd2' of the unit pixels 214a' and 214d' are rounded due to the corner rounding effect, the maximum corner spacing width $\sqrt{x2+a''}$ between unit pixels 214a', 214c', and 214d' adjacent one another becomes greater than the intended maximum corner spacing width $\sqrt{2x}$ (see FIG. 2C).

The corners Ca2' and Cd2' from among corners of first and fourth unit pixels 214a' and 214d' and a side sc of a third unit pixel 214c' may define a corner area CA2', where an area S2' of the corner area CAT may satisfy Equation 5:

$$S2'=\frac{1}{2}(\sqrt{2}x+a'')^2, \quad (5)$$

where a" denotes a corner rounding width increased at the corners Ca2' and Cb2' due to the corner rounding effect.

Referring to Equation 5 and FIG. 4B, if the gap area GA2 (refer to FIG. 4A) has a T-like shape, increase of a corner area due to the corner rounding effect may be reduced. In other words, similar to the example described above with reference to FIG. 3B, if a gap area has a cross-like shape, the area S_ref2 of the corner area CA_ref2 is affected by the corner rounding effect at the four corners Ca_ref2, Cb_ref2, Cc_ref2, and Cd_ref2 (refer to FIG. 3B). However, if a gap area has a T-like shape as in the present exemplary embodiment, the area S2' of the corner area CA2' is only affected by the corner rounding effect at the two corners Ca2' and Cd2'.

Figure 5A:
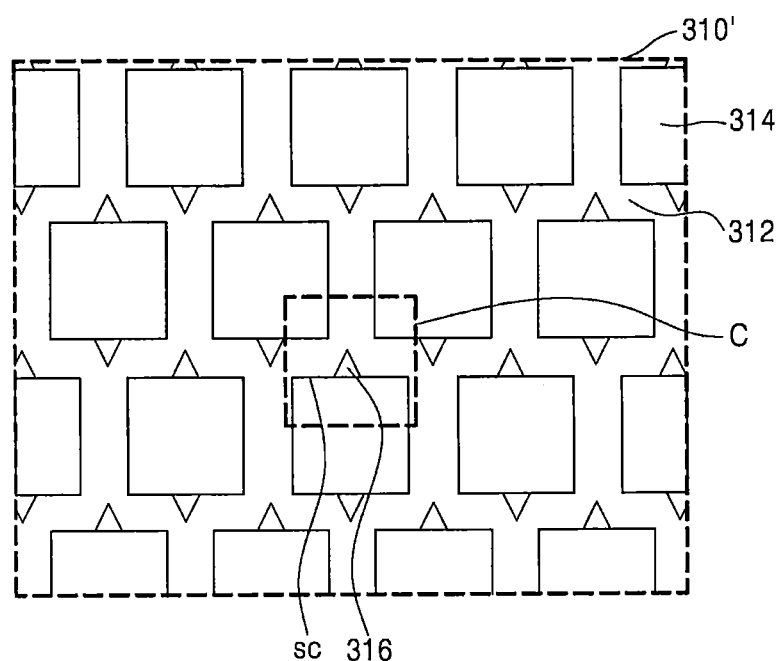
FIG. 5A is a plan view illustrating a pixel array according to another exemplary embodiment.
Figure 5A:
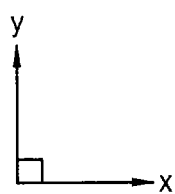

FIG. 5A is a plan view illustrating a pixel array according to another exemplary embodiment.

Referring to FIG. 5A, a pixel array 310' on and/or in a substrate may include a device isolation layer 312 and a plurality of unit pixels 314 defined by the device isolation layer 312. Each of unit pixels 314 of FIG. 5A has a structure similar to that of the unit pixels 214 described above with reference to FIG. 4A, but each of the unit pixels 314 includes a protrusion 316 unlike the unit pixels 214. Detailed descriptions of components other than the protrusion 316 will be omitted for simplification of explanation.

Referring to FIG. 5A, the protrusion 316 extending in a first direction (x-axis direction) is formed at at least one side sc of each of the plurality of unit pixels 314. In the illustrated embodiments, the protrusions 316 are formed at two opposite sides sc of each of the unit pixels 314 extending in the first direction (x-axis direction). However, in some embodiments, the protrusions 316 may be formed at only one of the sides sc extending in the first direction (x-axis direction).

Figure 5B:
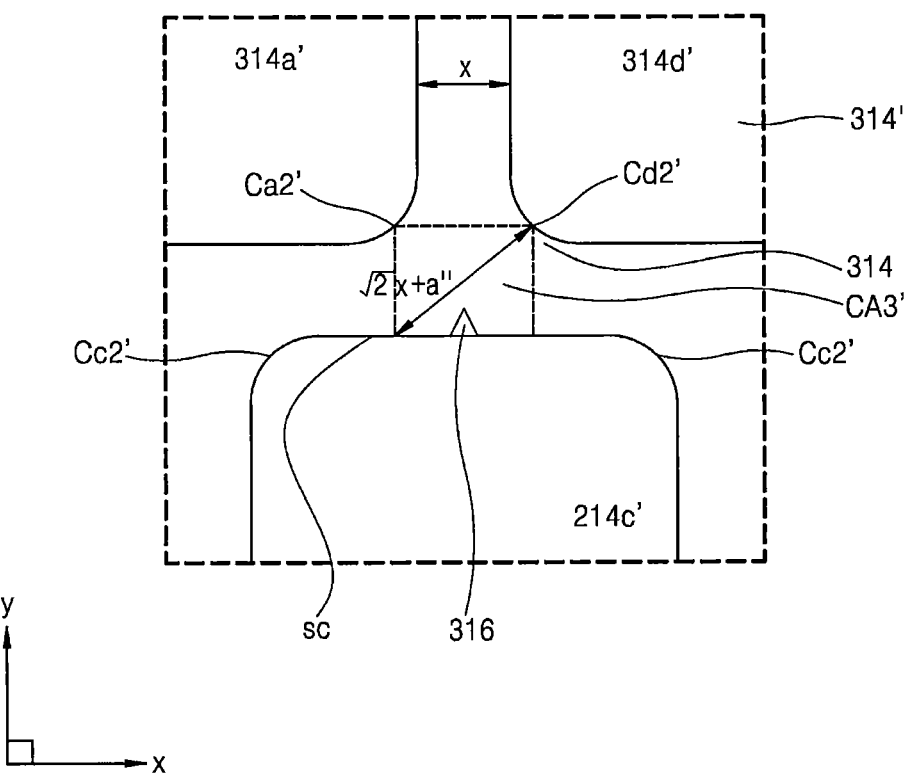
FIG. 5B is a diagram showing an area C of FIG. 5A in closer detail and exemplifies unit pixels with the corner rounding effect.

According to some embodiments, the protrusion 316 may be formed at the center of the side sc and reduce an area of the corner area CA3' (see FIG. 5B). Although the protrusion 316 has a triangular shape in the illustrated embodiments, the inventive concepts are not limited thereto, and the protrusion 316 may have any of various shapes.

FIG. 5B is a diagram showing an area C of FIG. 5A in closer detail and exemplifies unit pixels 314' with the corner rounding effect.

Referring to FIG. 5B, if the protrusion 316 is formed at at least one side sc of each of the plurality of unit pixels 314' extending in the first direction (x-axis direction), an area S3' of the corner area CA3' may be reduced by the area of the protrusion 316. In other words, the area S3' of the corner area CA3' may satisfy Equation 6:

$$S3'=\frac{1}{2}(\sqrt{2}x+a'')^2-Sp, \quad (6)$$

where a" denotes a corner rounding width increased at the corners Ca2' and Cb2' due to the corner rounding effect and Sp denotes an area of the protrusion 316. When the protrusion 316 is formed at at least one side sc of each of the plurality of unit pixels 314' as described above, that is, the protrusion 316 is formed in the corner area CA3', the area S3' of the corner area CA3' may be reduced by the area of the protrusion 316.

Figure 6A:
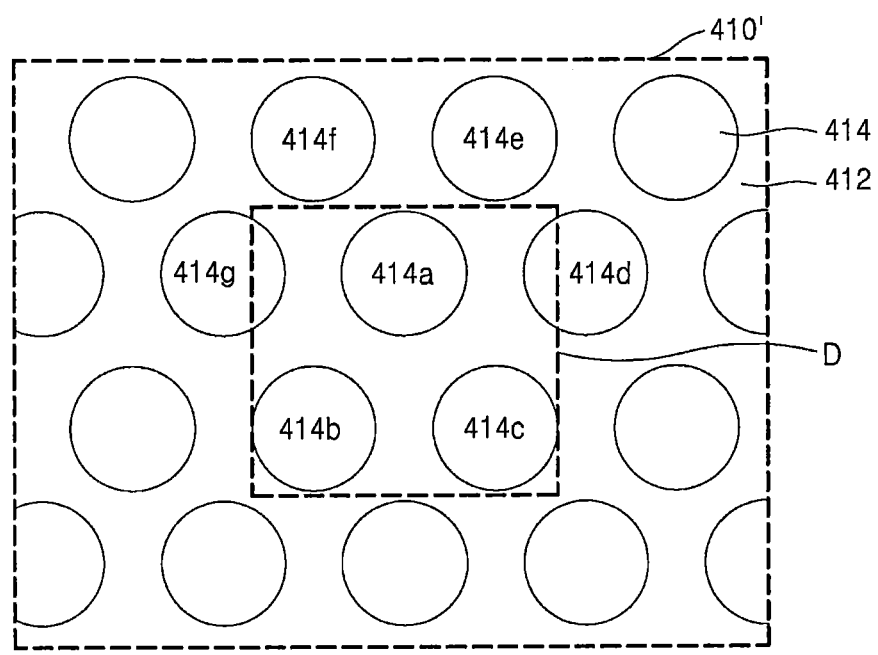
FIG. 6A is a plan view illustrating a portion of a pixel array according to another exemplary embodiment.
Figure 6B:
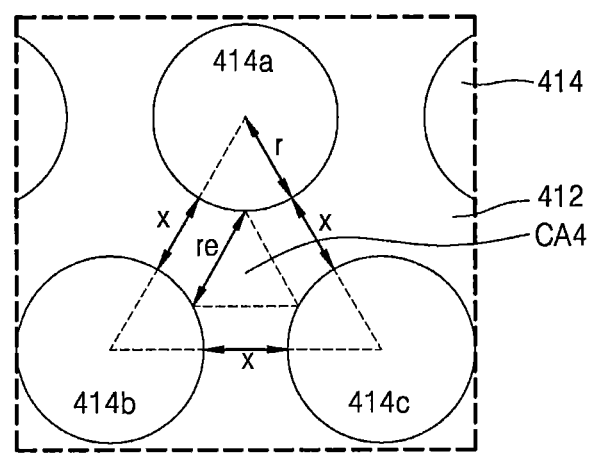
FIG. 6B is a diagram showing a portion D of FIG. 6A in closer detail.

FIG. 6A is a plan view illustrating a portion of a pixel array according to another exemplary embodiment. FIG. 6B is a diagram showing a portion D of FIG. 6A in closer detail.

Referring to FIGS. 6A and 6B, a pixel array 410' formed on and/or in a substrate may include a device isolation layer 412 and a plurality of unit pixels 414 defined by the device isolation layer 412. The device isolation layer 412 may be formed, for example, by filling a trench formed in a DTI operation with a silicon oxide or a polysilicon, for example. Along lines described above with reference to FIG. 2A, sidewalls of the device isolation layer 412 may be doped with a material with a high optical reflection index, thereby reducing optical crosstalk.

According to some embodiments, the unit pixel 414 may have a circular shape in a plan view image. According to some embodiments, the unit pixel 414 may have an elliptical shape. If the unit pixels 414 have a circular shape or an elliptical shape as in the present exemplary embodiment, the unit pixels 414 do not have rounded corners, and thus the corner rounding effect may be reduced or suppressed, and thus a difference between an intended pattern and an actually fabricated pattern that may occur during a photo operation or an etching operation may be reduced.

Unit pixels 414b through 414g may form a honeycomb-like structure, in which the unit pixels 414b through 414g are separated apart from one another by the distance x and are radially arranged around a unit pixel 414a. As shown in FIG. 6A, the unit pixels 414 may be linearly arranged along a first direction (x-axis direction) and may be arranged in a zig-zag manner in a second direction (y-axis direction) perpendicular to the first direction (x-axis direction).

If the unit pixels 414 are arranged as shown in FIGS. 6A and 6B, an area S4 of a corner area CA4 may be reduced without the corner rounding effect.

In detail, as shown in FIG. 6B, the corner area CA4 may be defined by a regular triangle formed between first through third unit pixels 414a, 414b, and 414c adjacent one another, where the area S4 of the corner area CA4 may satisfy Equation 7:

$$S4 = \frac{\sqrt{3}}{4}re^2, \quad (7)$$

where re denotes a length of a side of the regular triangle.

A relationship among the length re of a side of the regular triangle, the distance x, and a radius r of each of the unit pixels 414 is given by Equation 8:

$$re=(x+(2-\sqrt{3})*r)^2. \quad (8)$$

Based on Equations 7 and 8, a relationship among the area S4 of the corner area CA4, the distance x, and the radius r of each of the unit pixels 414 may be as shown in Equation 9:

$$S4 = \frac{\sqrt{3}}{4}(x+(2-\sqrt{3})*r)^2. \quad (9)$$

If the unit pixels 414 have a circular shape and are arranged in a honeycomb-like structure, even if the unit pixels 414 are separated apart from one another by the distance x like the unit pixels 114_ref1 described above with respect to FIG. 2C, the area S4 of the corner area CA4 may be reduced by adjusting the radius r of each of the unit pixels 414.

For the area S4 of the corner area CA4 to be smaller than the area S_ref1 of the corner area CA_ref1 described above with reference to FIG. 2C, the distance x and the radius r of each of the unit pixels 414 may be in a relationship as shown in Equation 10:

$$r \leq 1.939x. \quad (10)$$

In other words, if the radius r of each of the unit pixels 414 is adjusted within the range defined by Equation 10 above, the area S4 of the corner area CA4 becomes smaller than the area S1_ref1 of the corner area CA_ref1 described above with reference to FIG. 2C.

Figure 7A:
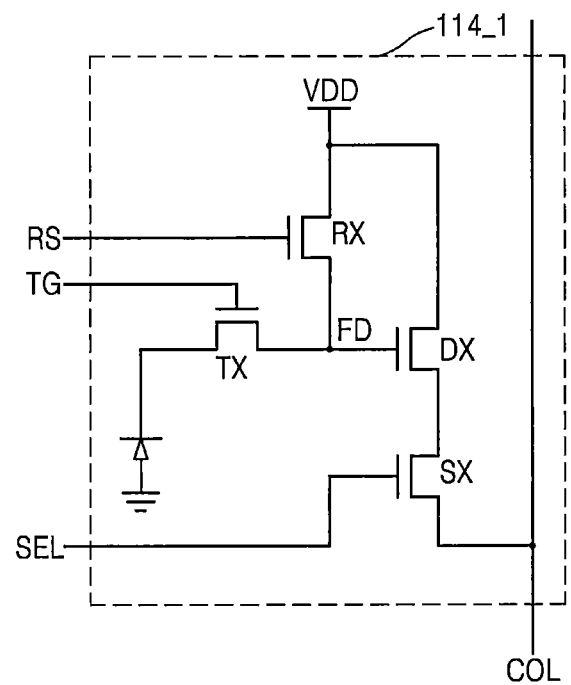
FIGS. 7A through 7C are circuit diagrams of unit pixels according to some embodiments.
Figure 7B:
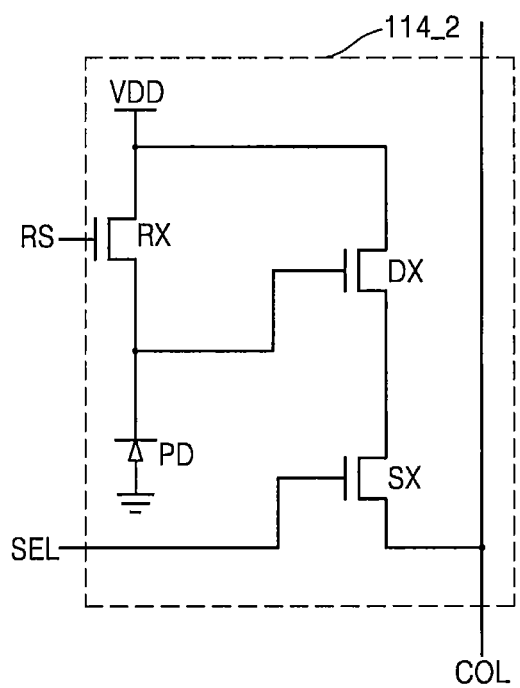
Figure 7C:
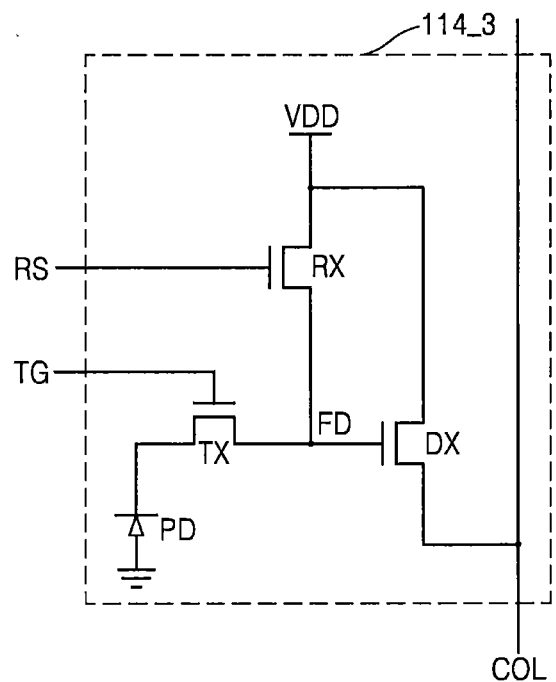

FIGS. 7A through 7C are circuit diagrams of unit pixels according to some embodiments. Referring to FIGS. 1 and 7A, a unit pixel 114_1 may include a photo diode PD, a transfer transistor Tx, a floating diffusion node FD, a reset transistor Rx, a driver transistor Dx, and a select transistor Sx. The photo diode PD is an example of a photoelectric transforming unit that may be used, and may include a photo diode, a photo gate, a pinned photo diode, or a combination thereof. FIG. 7A shows a unit pixel with a 4-transistor (4T) structure including one photo diode PD and four MOS transistors Tx, Rx, Dx, and Sx. However, the inventive concepts are not limited thereto, and a unit pixel may include any of various numbers of transistors.

The photo diode PD may generate photo charges that vary according to intensity of a light incident from a target object. The transfer transistor Tx may transfer the generated photo charges to the floating diffusion node FD based on a transfer control signal TG output by the row driver 120. The driver transistor Dx may amplify a potential at the floating diffusion node and transfer the photo charges to the select transistor Sx. A drain terminal of the select transistor Sx is connected to a source terminal of the driver transistor Dx, and the select transistor Sx may output a pixel signal to a column line connected to the unit pixel 114_1 according to a selecting signal SEL output by the row driver 120. The reset transistor Rx may reset the floating diffusion node FD to VDD responsive to a reset control signal RS output by the row driver 120.

Referring to FIG. 7B, a unit pixel 114_2 may have a 3-transistor (3T) structure and may include a photo diode PD, a reset transistor Rx, a driver transistor Dx, and a select transistor Sx. Photo charges generated by the photo diode PD may be immediately accumulated at the floating diffusion node FD and pixel signals may be output to column lines based on operations of the driver transistor Dx and the select transistor Sx.

Referring to FIG. 7C, a unit pixel 114_3 may have a 3T structure and may include a photo diode PD, a transfer transistor Tx, a reset transistor Rx, and a driver transistor Dx. The reset transistor Rx may be embodied as an n-channel depression type transistor. The reset transistor Rx may perform a function similar to that of the select transistor Sx by resetting the floating diffusion node FD or setting the floating diffusion node FD to a low level (e.g., 0V) responsive to a reset control signal output by the row driver 120.

Figure 8:
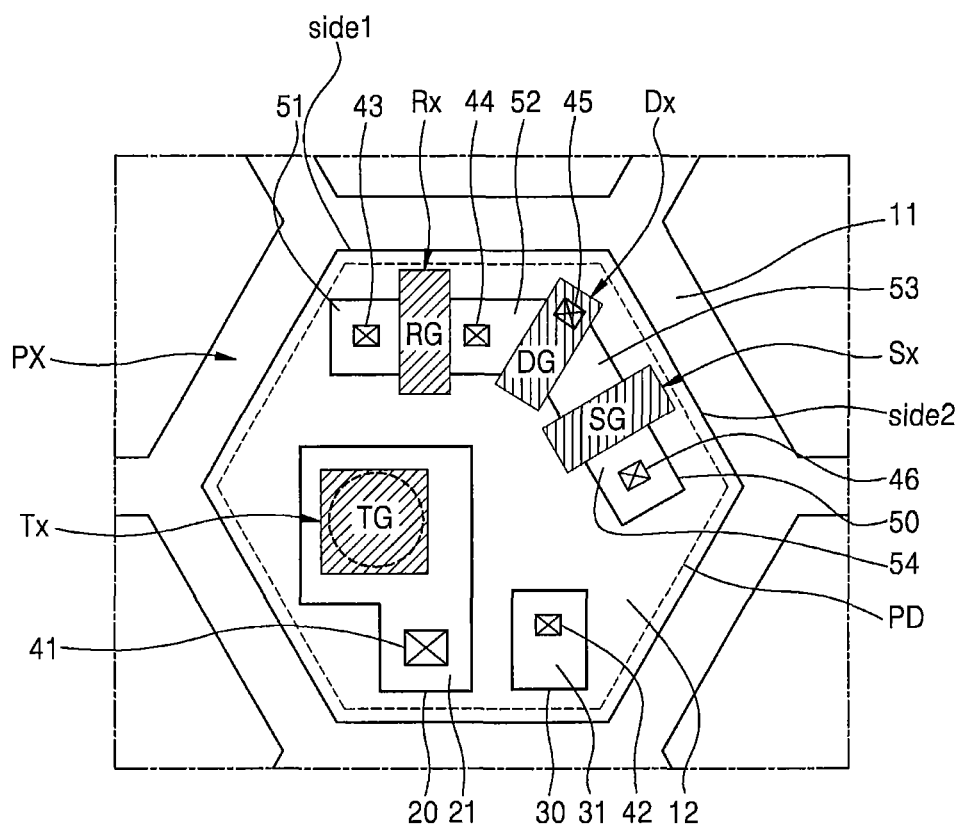
FIG. 8 is a plan view illustrating a structure of each of unit pixels according to some embodiments.

FIG. 8 is a plan view illustrating a structure of a unit pixel according to some embodiments. Referring to FIG. 8, a pixel array of an image sensor may include a first device isolation layer 11 and a plurality of unit pixels PX defined by the first device isolation layer 11. Each of the unit pixels PX may include a photoelectric transforming unit PD formed in and/or on a semiconductor substrate, a second device isolation layer 12 that defines active areas 20, 30, and 50, and a plurality of transistors Tx, Rx, Dx, and Sx formed at the active areas 20, 30, and 50.

The photoelectric transforming unit PD may be a region formed inside the semiconductor substrate and may have a first conductivity type. The first conductivity type may be n type, for example, the photoelectric transforming unit PD may be an n type semiconductor region doped with an n type impurity. In this case, the semiconductor substrate may comprise a p-type material and the n type photoelectric transforming unit PD may form a PN junction with the p-type semiconductor material of the substrate and form a photo diode. The photoelectric transforming unit PD may receive an incident light and generate and accumulate charges. The photoelectric transforming unit PD may be formed apart from sidewalls of the first device isolation layer 11.

The second device isolation layer 12 defining the active areas 20, 30, and 50 may be formed at each of the unit pixels PX. The second device isolation layer 12 may be formed inside the first device isolation layer 11 and may contact the first device isolation layer 11.

The second device isolation layer 12 may be formed of a same insulation material as the first device isolation layer 11. The second device isolation layer 12 may be, for example, a trench-type device isolation layer and may be formed in a shallow trench isolation (STI) operation. The active areas 20, 30, and 50 may include a first active area 20, a second active area 30, and a third active area 50 that are isolated from one another by the second device isolation layer 12.

A floating diffusion region 21 and a transfer gate TG of the transfer transistor Tx may be formed at the first active area 20. A ground region 31 may be formed at the second active area 30.

The floating diffusion region 21 may have the first conductivity type. For example, the floating diffusion region 21 may be an N+ type semiconductor region doped with an N+ type impurity. The floating diffusion region 21 may correspond to the floating diffusion node FD shown in FIG. 7A.

The ground region 31 may have a second conductivity type. In detail, the ground region 31 may be a P+ type semiconductor region doped with a P+ type impurity.

The transfer gate TG may be formed of polysilicon.

According to some embodiments, the transfer transistor Tx of FIG. 7A may include the photoelectric transforming unit PD, the floating diffusion region 21, and the transfer gate TG.

Charges generated by the photoelectric transforming unit PD may be transferred to the floating diffusion region 21 via a channel (not shown) formed below the transfer gate TG.

If the unit pixel PX has a hexagonal shape as in the illustrated embodiments, the third active area 50 may extend in a L-clamp-like shape along a first side side1 and a second side side2 from among sides of the hexagonal unit pixel PX that are adjacent the third active area 50. The shape of the third active area 50 is not limited thereto, and various modifications may be made therein according to shape of the unit pixel PX.

The reset transistor Rx including a reset gate RG, the driver transistor Dx including a drive gate DG, and the select transistor Sx including a select gate SG may be formed at the third active area 50. In detail, the gates RG, DG, and SG and first through fourth semiconductor regions 51, 52, 53, and 54 forming source/drain areas of the transistors Rx, Dx, and Sx may be formed at the third active area 50.

According to some embodiments, the gates RG, DG, and SG may be formed of polysilicon. The first through fourth semiconductor regions 51, 52, 53, and 54 may be of the first conductivity type. In detail, the first through fourth semiconductor regions 51, 52, 53, and 54 may be N+ type semiconductor regions. The first semiconductor region 51 may be a source of the reset transistor Rx, whereas the second semiconductor region 52 may be a drain of the reset transistor Rx. The reset transistor Rx and the driver transistor Dx may share the second semiconductor region 52. The second semiconductor region 52 may be a drain of the driver transistor Dx, whereas the third semiconductor region 53 may be a source of the driver transistor Dx. The driver transistor Dx and the select transistor Sx may share the third semiconductor region 53. The third semiconductor region 53 may be a drain of the select transistor Sx, whereas the fourth semiconductor region 54 may be a source of the select transistor Sx.

According to some embodiments, the floating diffusion region 21 may be electrically connected to the first semiconductor region 51, which is the source of the reset transistor Rx, via a first contact 41 and a third contact 43.

According to some embodiments, the floating diffusion region 21 may be electrically connected to the drive gate DG of the driver transistor Dx via the first contact 41, the third contact 43, and a fifth contact 45.

The ground region 31 may be electrically connected to a ground voltage terminal GND via a second contact 42.

The second semiconductor region 52, which is a drain of the reset transistor Rx and the driver transistor Dx, may be electrically connected to a power supply terminal VDD via a fourth contact 44.

The fourth semiconductor region 54, which is a source of the select transistor Sx, may be electrically connected to an output terminal OUT via a sixth contact 46.

Although each of the unit pixels PX includes all of the transistors Rx, Dx, and Sx in the illustrated embodiments, the inventive concepts are not limited thereto. For example, the unit pixel PX may have a structure in which at least one of the transistors Rx, Dx, and Sx is omitted or a structure in which at least one transistor is shared as shown in FIG. 9A and FIG. 9B.

Figure 9A:
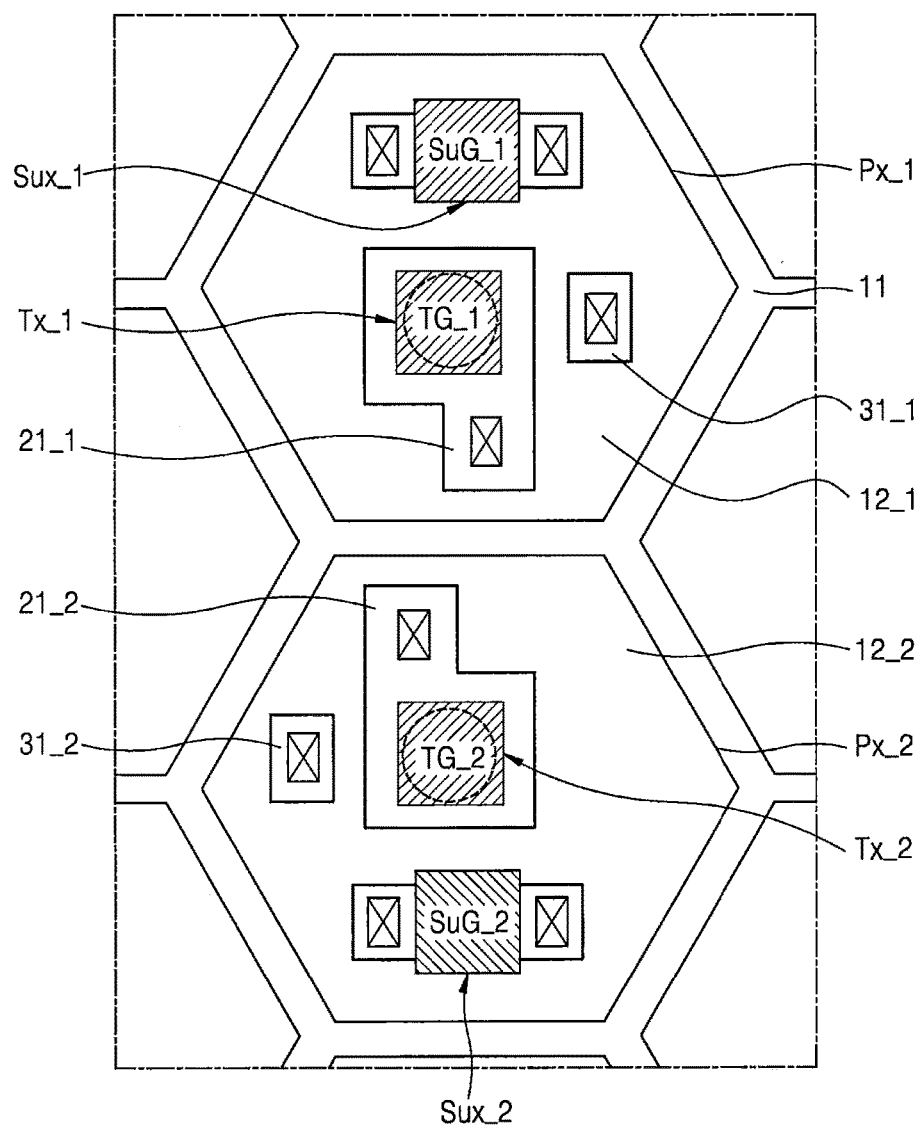
FIG. 9A is a block diagram illustrating a layout of two unit pixels Px_1 and Px_2 according to some embodiments.
Figure 9B:
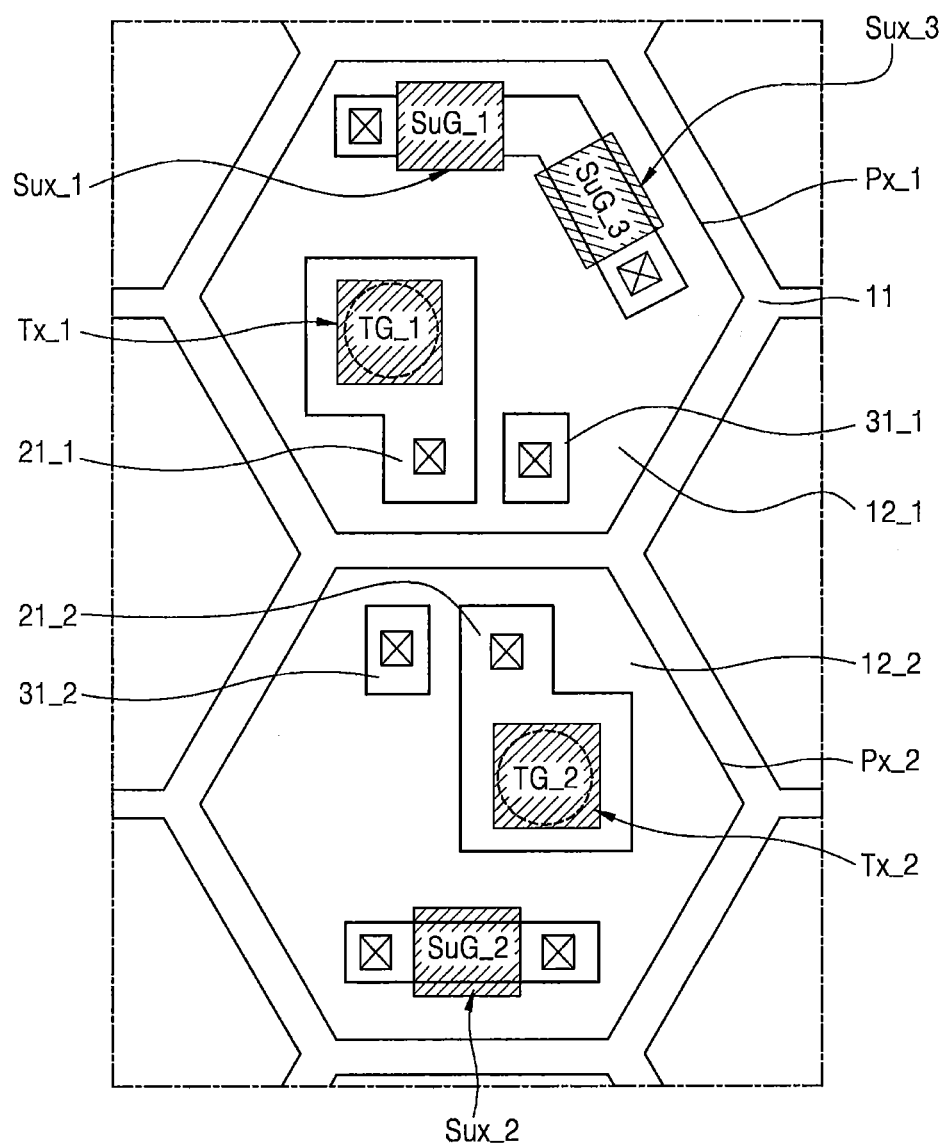
FIG. 9B is a block diagram illustrating a layout of two unit pixels Px_1 and Px_2 according to some embodiments.

FIG. 9A is a block diagram illustrating a layout of two adjacent unit pixels Px_1 and Px_2 using shared transistors according to some embodiments. The first unit pixel Px_1 and the second unit pixel Px_2 may be electrically isolated from each other by the first device isolation layer 11, and internal components of each of the first unit pixel Px_1 and the second unit pixel Px_2 may be electrically isolated from one another by second device isolation layers 12_1 and 12_2. The first unit pixel Px_1 and the second unit pixel Px_2 include floating diffusion areas 21_1 and 21_2, ground regions 31_1 and 31_2, respectively. The first unit pixel Px_1 and the second unit pixel Px_2 include a first transfer transistor Tx_1 and a second transfer transistor Tx_2, respectively.

According to some embodiments, the respective floating diffusion areas 21_1 and 21_2 of the first unit pixel Px_1 and the second unit pixel Px_2 may be connected to each other via a conductive line (not shown) and function as a single node.

The first unit pixel Px_1 and the second unit pixel Px_2 may include a first supplemental transistor Sux_1 and a second supplemental transistor Sux_2, respectively. According to some embodiments, the first supplemental transistor Sux_1 may function like the reset transistor Rx described above with respect to FIG. 8, whereas the second supplemental transistor Sux_2 may function like the driver transistor Dx described above with respect to FIG. 8. In this case, the first unit pixel Px_1 and the second unit pixel Px_2 may share the floating diffusion areas 21_1 and 21_2, the reset transistor Rx, and the driver transistor Dx, and thus each of the first unit pixel Px_1 and the second unit pixel Px_2 may include only two transistors. Therefore, an area occupied by each pixel in the first unit pixel Px_1 and the second unit pixel Px_2 may be minimized.

FIG. 9B is a block diagram illustrating a layout of two adjacent unit pixels Px_1 and Px_2 using shared transistors according to some embodiments. The first unit pixel Px_1 and the second unit pixel Px_2 may be electrically isolated from each other by the first device isolation layer 11, and internal components of each of the first unit pixel Px_1 and the second unit pixel Px_2 may be electrically isolated from one another by second device isolation layers 12_1 and 12_2. The first unit pixel Px_1 and the second unit pixel Px_2 include floating diffusion areas 21_1 and 21_2, ground regions 31_1 and 31_2, respectively. The first unit pixel Px_1 and the second unit pixel Px_2 include a first transfer transistor Tx_1 and a second transfer transistor Tx_2, respectively.

According to some embodiments, the respective floating diffusion areas 21_1 and 21_2 of the first unit pixel Px_1 and the second unit pixel Px_2 may be connected to each other via a conductive line (not shown) and function as a single node.

The first unit pixel Px_1 may include a first supplemental transistor Sux_1 and a third supplemental transistor Sux_3, and the second unit pixel Px_2 may include a second supplemental transistor Sux_2, respectively. According to some embodiments, the first supplemental transistor Sux_1 may function like the reset transistor Rx described above with respect to FIG. 8 and the third supplemental transistor Sux_3 may function like the select transistor Sx described above with respect to FIG. 8, whereas the second supplemental transistor Sux_2 may function like the driver transistor Dx described above with respect to FIG. 8. In this case, the first unit pixel Px_1 and the second unit pixel Px_2 may share the floating diffusion areas 21_1 and 21_2, the reset transistor Rx, the select transistor Sx and the driver transistor Dx, and thus each of the first unit pixel Px_1 and the second unit pixel Px_2 may include less than three transistors. Therefore, an area occupied by each pixel in the first unit pixel Px_1 and the second unit pixel Px_2 may be minimized.

Although FIG. 9A and FIG. 9B show that the first unit pixel Px_1 and the second unit pixel Px_2 are arranged in a vertical direction, the first unit pixel Px_1 and the second unit pixel Px_2 may have other arrangements. A plurality of first unit pixels Px_1 and a plurality of second unit pixels Px_2 may be repeatedly arranged to form a pixel array, such as those described above with reference to FIGS. 1 through 6B.

Figure 10A:
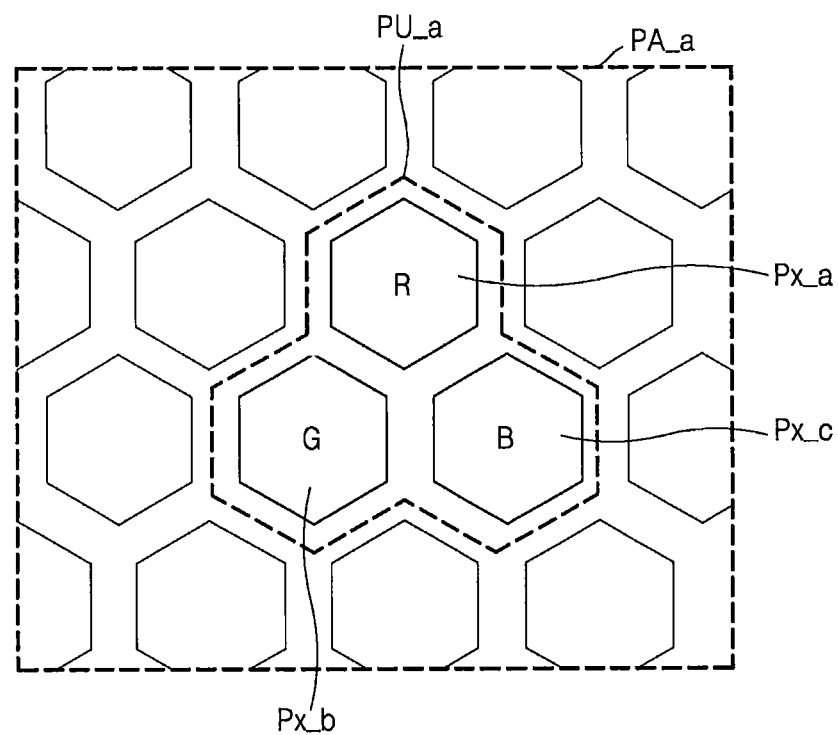
FIGS. 10A through 10C are diagrams illustrating color filter arrangements applicable to pixel arrays according to some embodiments.
Figure 10B:
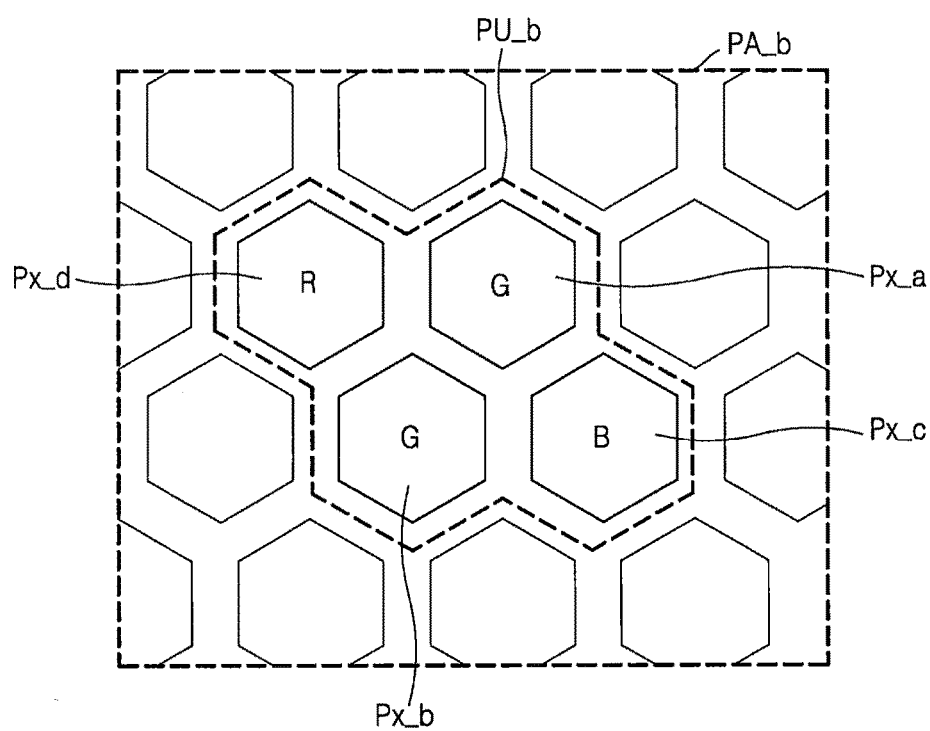
Figure 10C:
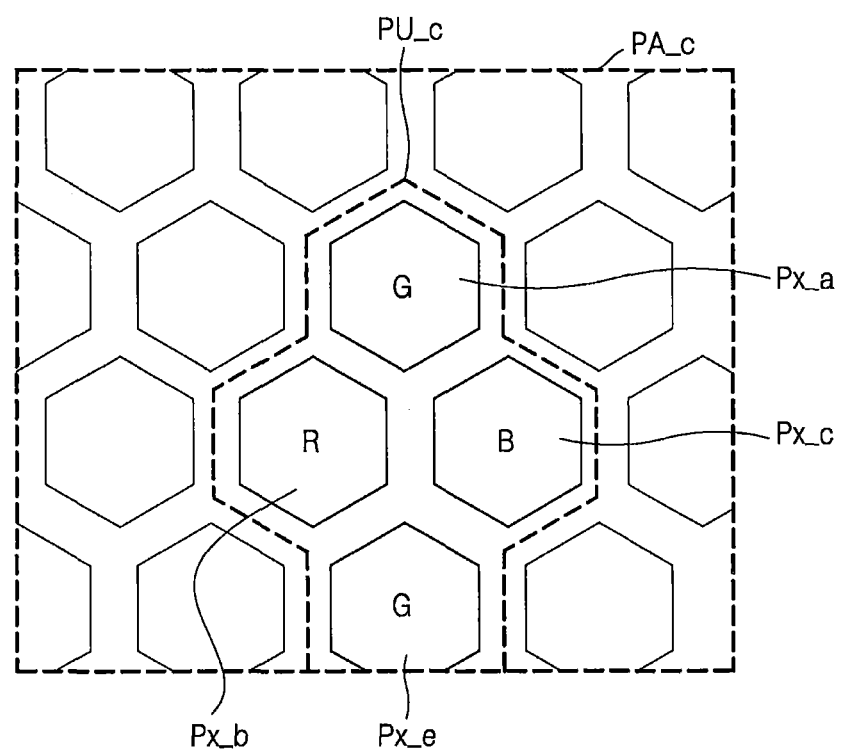

FIGS. 10A through 10C are diagrams illustrating color filter arrangements applicable to pixel arrays according to some embodiments. Referring to FIG. 10A, a pixel group PU_a including three adjacent unit pixels Px_a, Px_b, and Px_c may be included in a pixel array PA_a. Various color filters (not shown) may be arranged at each of the unit pixels Px_a, Px_b, and Px_c included in the pixel group PU_a. The color filters may selectively transmit lights of wavelengths corresponding to particular colors (e.g., red, green, blue, magenta, yellow, cyan, etc.)

According to some embodiments, as shown in FIG. 10A, in the pixel group PU_a, a red filter R may be arranged at a first unit pixel PX_a, a green filter G may be arranged at a second unit pixel PX_b, and a blue filter B may be arranged at a third unit pixel PX_c.

Referring to FIGS. 10B and 10C, the pixel groups PU_b and PU_c, each of which consists of four unit pixels adjacent one another, may be included in pixel arrays PA_b and PA_c, respectively. Unlike the pixel group PU_a described above with reference to FIG. 10A, each of the pixel groups PU_b and PU_c may include four unit pixels adjacent one another. Various color filters may be arranged at each of unit pixels of the pixel groups PU_b and PU_c. For example, as shown in FIG. 10B, the green filter G may be arranged at the first and second unit pixels Px_a and Px_b included in the pixel group PU_b, the blue filter B may be arranged at the third unit pixel PX_c, and the red filter R may be arranged at the fourth unit pixel PX_d. As shown in FIG. 10C, the green filter G may be arranged at the first and fifth unit pixels Px_a and Px_e included in the pixel group PU_b, the red filter R may be arranged at the second unit pixel PX_b, and the blue filter B may be arranged at the third unit pixel PX_c.

Figure 11:
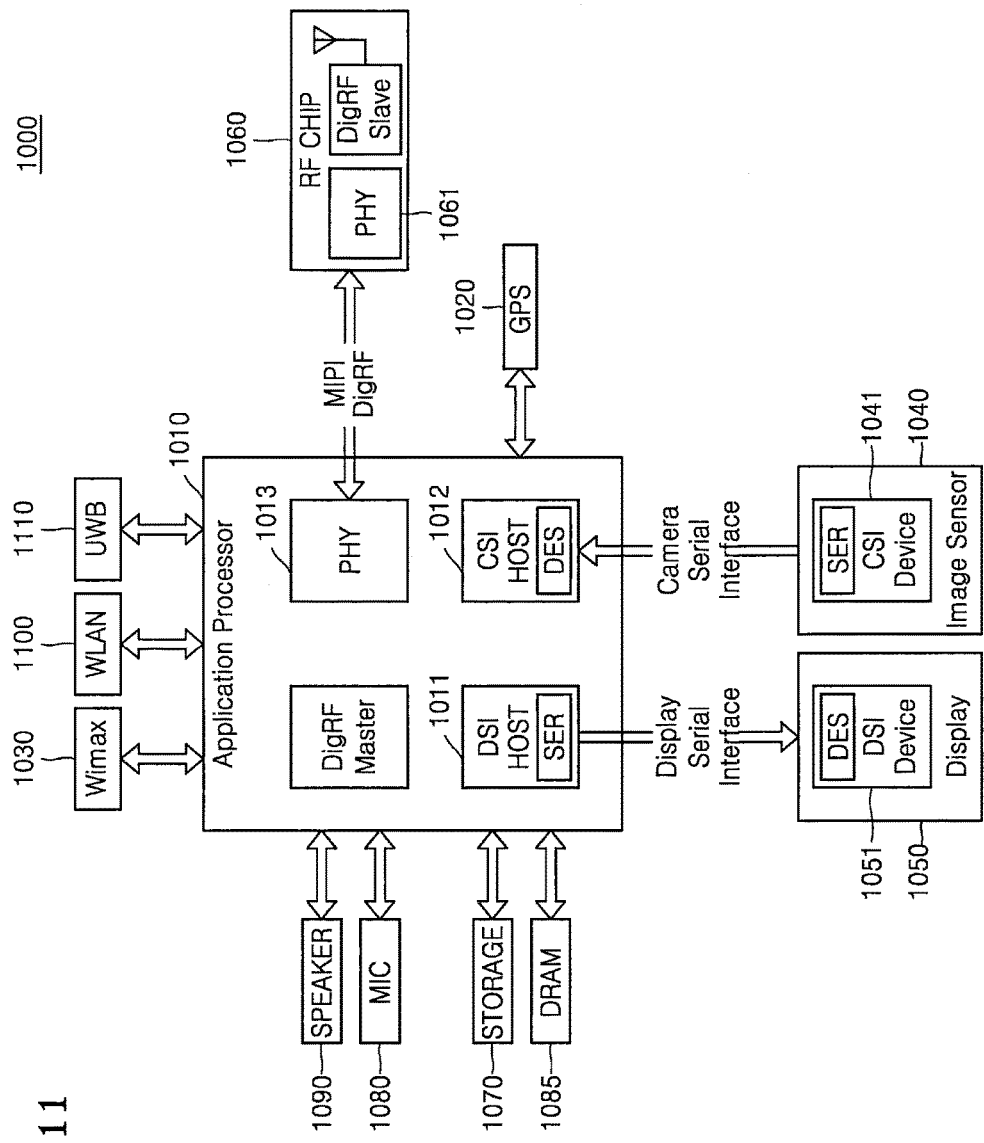
FIG. 11 is a diagram illustrating an electronic system including an image sensor having a pixel pattern according to some embodiments.

FIG. 11 is a diagram illustrating an electronic system 1000 including an image sensor having a pixel pattern according to some embodiments.

Referring to FIG. 11, the electronic system 1000 may be embodied as a data processing device that is capable of using or supports a mobile industry processor interface (MIPI), e.g., a mobile phone, a PDA, a PMP, an IPTV, or a smart phone.

The electronic system 1000 may include an application processor 1010, an image sensor 1040, and a display 1050.

A CSI host 1012 embodied at the application processor 1010 may serial communicate with a CSI device 1041 of the image sensor 1040 via a camera serial interface (CSI). An optical de-serializer may be embodied at the CSI host 1012, whereas an optical serializer may be embodied at the CSI device 1041.

A DSI host 1011 embodied at the application processor 1010 may serial communicate with a DSI device 1051 of the display 1050 via a display serial interface (DSI). An optical serializer may be embodied at the DSI host 1011, whereas an optical de-serializer may be embodied at the DSI device 1051.

The image sensor 1040 may include a pixel array having a pixel pattern according to one of the embodiments described above with reference to FIGS. 1 through 10C.

The electronic system 1000 may further include a RF chip 1060 capable of communicating with the application processor 1010. A PHY 1013 of the electronic system 1000 and a PHY 1061 of the RF chip 1060 may exchange data according to MIPI DigRF.

The electronic system 1000 may further include a GPS 1020, a storage 1070, a microphone 1080, a DRAM 1085, and a speaker 1090, where the electronic system 1000 may communicate by using a Wimax 1030, a WLAN 1100, and a UWB 1110.

Figure 12:
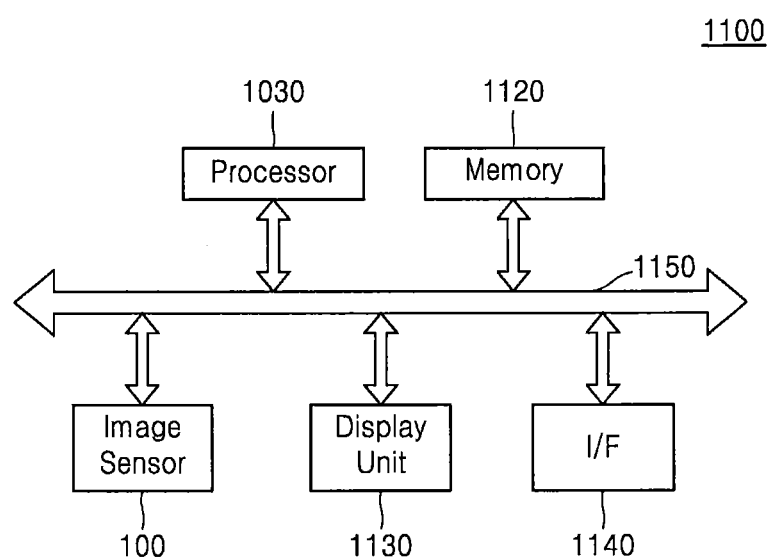
FIG. 12 is a block diagram showing an image processing system including an image sensor having a pixel pattern according to some embodiments.

FIG. 12 is a block diagram showing an image processing system 1100 including an image sensor having a pixel pattern according to some embodiments.

Referring to FIG. 12, the image processing system 1100 may include a processor 1110, a memory 1120, the image sensor 100, a display unit 1130, and an interface 1140.

The processor 1110 may control operations of the image sensor 100. For example, the processor 1110 may generate a 2D image or a 3D image based on depth information and color information (e.g., at least one of red information, green information, blue information, magenta information, cyan information, and yellow information) from the image sensor 100.

The memory 1120 may store a program for controlling operations of the image sensor 100 via the bus 1150 and the generated image under the control of the processor 1110, and the processor 1110 may execute the program by accessing data stored in the memory 1120. The memory 1120 may be embodied as a non-volatile memory, for example.

The image sensor 100 may generate 2D or 3D image information based on respective digital pixel signals (e.g., color information or depth information) under the control of the processor 1110.

The image sensor 100 may include a pixel array having a pixel pattern according to some embodiments described above with reference to FIGS. 1 through 10C.

The display unit 1130 may receive the generated image from the processor 1110 or the memory 1120 and display via a display element (e.g., an LCD, an AMOLED, etc.).

The interface 1140 may be embodied as an interface for inputting and outputting 2D images or 3D images. According to some embodiments, the interface 1140 may be embodied as a wireless interface.

FIGS. 13 through 17 are diagrams showing examples of multimedia devices employing image sensors according to some embodiments.

Image sensors including pixel patterns according to some embodiments may be applied to various multimedia devices with image pickup function.

Figure 13:
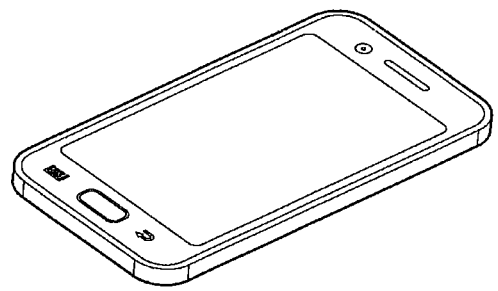
FIGS. 13 through 17 are diagrams showing examples of multimedia devices employing image sensors according to some embodiments.
Figure 14:
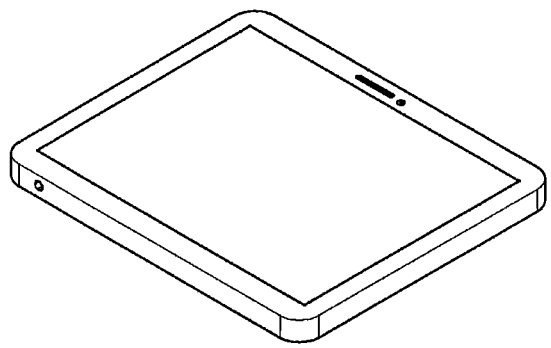

For example, an image sensor according to some embodiments may be applied to a mobile phone or smart phone 3000 as shown in FIG. 13 or may be applied to a tablet or smart tablet 4000 as shown in FIG. 14.

Figure 15:
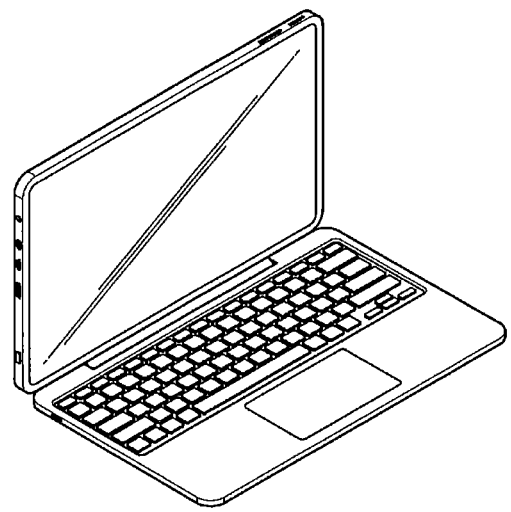
Figure 16:
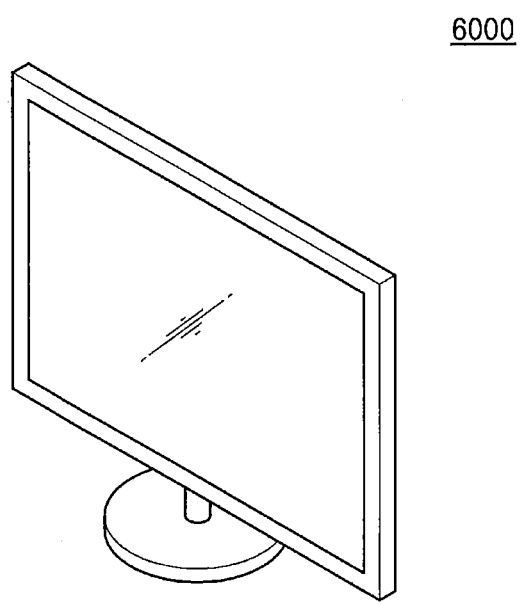
Figure 17:
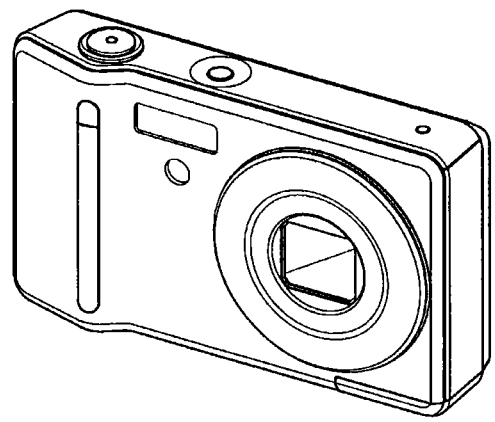

Furthermore, an image sensor according to some embodiments may be applied to a laptop computer 5000 as shown in FIG. 15 or may be applied to a smart TV 6000 as shown in FIG. 16. An image sensor according to some embodiments may also be applied to a digital camera or digital camcorder 7000.

While the inventive concepts has been particularly shown and described with reference to some embodiments thereof, it will be understood that various changes in form and details may be made therein without departing from the spirit and scope of the following claims.

What is claimed is:

1. A device comprising:
   a substrate; and
   a plurality of unit pixels which have a hexagonal shape with rounded corners disposed in and/or on the substrate, arranged in a honeycomb pattern and separated from one another by a deep trench isolation (DTI) layer.

2. The device of claim 1, wherein the plurality of unit pixels comprises a group of unit pixels radially arranged around and equidistant from a central unit pixel.

3. The device of claim 1, wherein the DTI layer includes a Y-shaped portion between adjacent first, second and third unit pixels of the plurality of unit pixels.

4. A device comprising:
   a substrate; and a plurality of unit pixels which have rounded corners disposed in and/or on the substrate, arranged in a honeycomb pattern and separated from one another by a deep trench isolation (DTI) layer, wherein the DTI layer includes a Y-shaped portion between adjacent first, second and third unit pixels of the plurality of unit pixels, wherein the first, second and third unit pixels are separated from one another by a distance x, and wherein a portion of the DTI layer bounded by segments connecting adjacent corners of the first, second and third unit pixels has an area S given by:

$$S < x^2.$$

5. The device of claim 4, wherein each of the first, second and third unit pixels has a rounded hexagonal shape and wherein the portion of the DTI layer bounded by the segments connecting the adjacent corners of the first, second and third unit pixels has an area S given by:

$$S4 = \frac{\sqrt{3}}{4}(x + 2a')^2,$$

wherein a' denotes a corner rounding width.

6. The device of claim 4, wherein the distance x is from about 100 nm to about 300 nm.

7. A device comprising:
a substrate; and
a plurality of unit pixels which have rounded corners disposed in and/or on the substrate, arranged in a honeycomb pattern and separated from one another by a deep trench isolation (DTI) layer, wherein each of the unit pixels comprises a shallow trench isolation (STI) pattern that defines at least one or more active areas within the unit pixel.

8. The device of claim 7, wherein each of the unit pixels has a circular shape, wherein adjacent first and second unit pixels in a first row of the unit pixels are separated from one another by a distance x, wherein each of the first and second unit pixels are separated from an adjacent third unit pixel in an adjacent second row of the unit pixels by the distance x, and wherein a triangular portion of the DTI layer defined by segments between the first, second and third unit pixels has an area S given by:

$$S = \frac{\sqrt{3}}{4}(x + (2 - \sqrt{3}) * r)^2,$$

wherein r denotes a radius of the first, second and third unit pixels.

9. The device of claim 8, wherein the distance x and the radius r satisfy the following:

$$r \leq 1.939x.$$

* * * * *